(12) United States Patent
Frank et al.

(10) Patent No.: US 7,015,568 B2
(45) Date of Patent: Mar. 21, 2006

(54) SYSTEM FOR ULTRAVIOLET ATMOSPHERIC SEED LAYER REMEDIATION

(75) Inventors: Aaron Frank, Murphy, TX (US);
David Gonzalez, Plano, TX (US); John DeGenova, Garland, TX (US);
Srinavas Raghavan, Plano, TX (US);
Deepak A. Ramappa, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/645,679

(22) Filed: Aug. 21, 2003

(65) Prior Publication Data

US 2005/0042886 A1 Feb. 24, 2005

(51) Int. Cl.
*H01L 23/552* (2006.01)

(52) U.S. Cl. ........................... 257/659; 257/678

(58) Field of Classification Search ............ 257/659, 257/660, 678, 682
See application file for complete search history.

(56) References Cited

U.S. PATENT DOCUMENTS

| 4,255,383 A * | 3/1981 | Schenck ............... 422/24 |
| 4,317,041 A * | 2/1982 | Schenck .............. 250/435 |
| 4,723,420 A * | 2/1988 | Sitte ..................... 62/51.1 |
| 6,099,735 A * | 8/2000 | Kelada ................ 210/652 |
| 6,254,689 B1 * | 7/2001 | Meder ..................... 134/1 |
| 6,555,835 B1 * | 4/2003 | Wydeven ........... 250/504 R |

FOREIGN PATENT DOCUMENTS

| EP | 0661110 A1 | 7/1995 |
| JP | 06083379 | 8/1994 |

* cited by examiner

*Primary Examiner*—David Nhu
(74) *Attorney, Agent, or Firm*—Jacqueline J. Garner; W. James Brady, III; Frederick J. Telecky, Jr.

(57) ABSTRACT

The present invention provides a system for removing organic contaminants (216) from a copper seed layer that has been deposited on a semiconductor substrate (206). The present invention provides a housing (204) to enclose the semiconductor substrate within. An ultraviolet radiation source (210) is disposed within the housing. A treatment medium (208) is also provided within the housing. The semiconductor substrate is enclosed within the housing and exposed to the treatment medium. The ultraviolet radiation source exposes the semiconductor substrate to ultraviolet radiation, desorbing the contaminants from the seed layer.

10 Claims, 1 Drawing Sheet

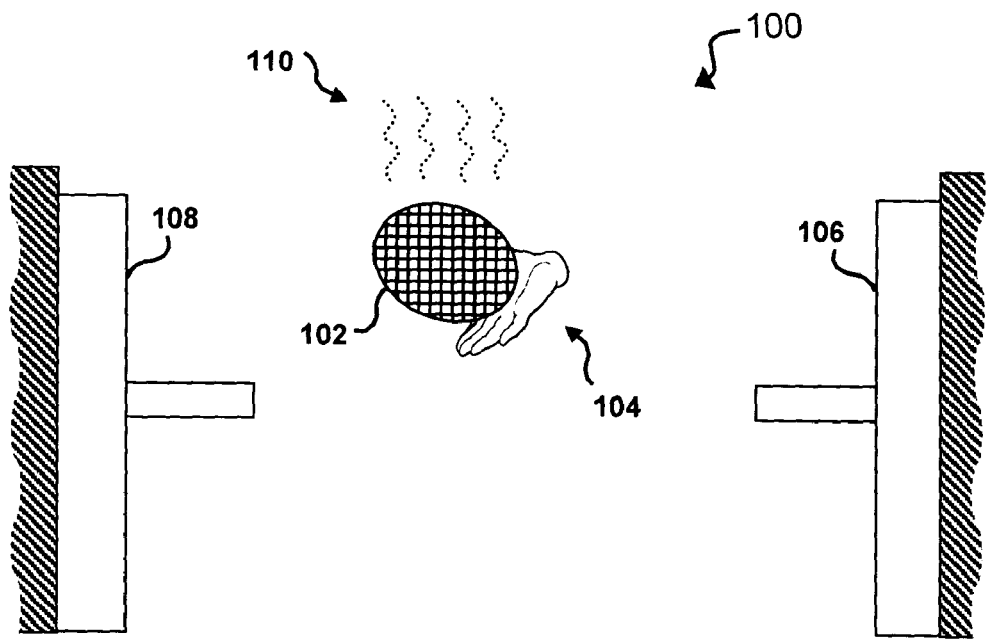
FIG. 1 (*Prior Art*)
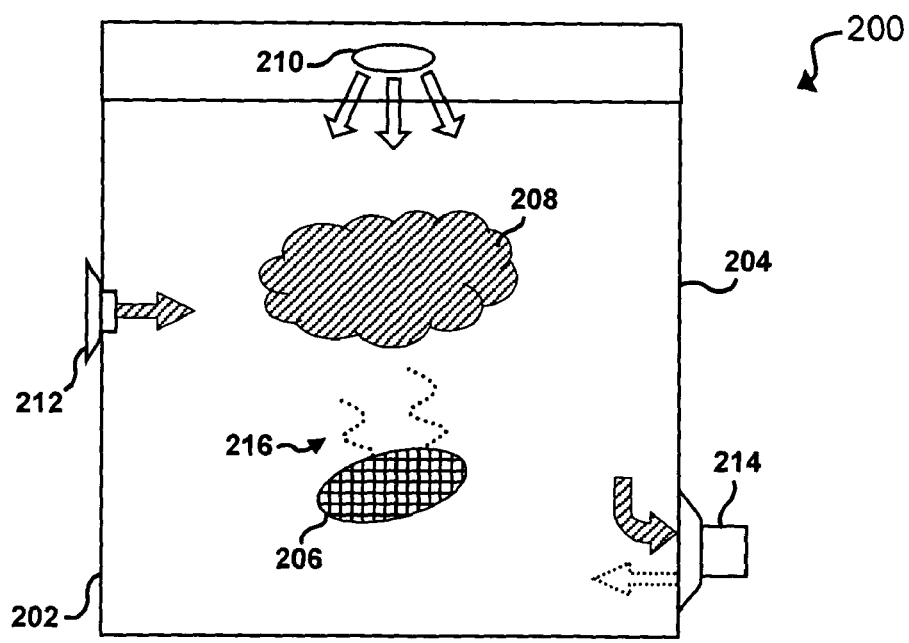
FIG. 2

SYSTEM FOR ULTRAVIOLET ATMOSPHERIC SEED LAYER REMEDIATION

TECHNICAL FIELD OF THE INVENTION

The present invention relates generally to the field of semiconductor devices and, more particularly, to apparatus and methods for remediating seed layer surfaces during device fabrication.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor material properties and behaviors.

The increased packing density of the integrated circuit generates numerous challenges to the semiconductor manufacturing process. Every device must be smaller without damaging the operating characteristics of the integrated circuit devices. High packing density, low heat generation, and low power consumption, with good reliability and long operation life must be maintained without any functional device degradation. Increased packing density of integrated circuits is usually accompanied by smaller feature size.

As integrated circuits become denser, the widths of interconnect layers that connect transistors and other semiconductor devices of the integrated circuit are reduced. As the widths of interconnect layers and semiconductor devices decrease, their resistance increases. As a result, semiconductor manufacturers seek to create smaller and faster devices by using, for example, a copper interconnect instead of a traditional aluminum interconnect. Unfortunately, copper is very difficult to etch in most semiconductor process flows. Therefore, damascene processes have been proposed and implemented to form copper interconnects.

Damascene methods usually involve forming a trench and/or an opening in a dielectric layer that lies beneath and on either side of the copper-containing structures. Once the trenches or openings are formed, a blanket layer of the copper-containing material is formed over the entire device. Electrochemical deposition (ECD) is typically the only practical method to form a blanket layer of copper. The thickness of such a layer must be at least as thick as the deepest trench or opening. After the trenches or openings are filled with the copper-containing material, the copper-containing material over them is removed, e.g., by chemical-mechanical polishing (CMP), so as to leave the copper-containing material in the trenches and openings but not over the dielectric or over the uppermost portion of the trench or opening.

Unfortunately, however, copper tends to be rather difficult to deposit directly on dielectric via ECD, due largely to the material properties of copper and most common dielectric materials. Often, a relatively thick layer of copper will not adhere to a dielectric in a uniform and stable manner. Obviously, this can cause a number of semiconductor yield and reliability problems. Therefore, a thin starter layer of copper—a seed layer—is usually deposited on the dielectric first. The deposition of this relatively thin layer—on the order of 100 Å–1000 Å, depending on contour of the surface—provides for more stable and uniform initial application of copper to the dielectric. Once this seed layer is in place, thicker layers of copper may be plated directly on the copper "seed". The thicker copper adheres well to the copper "seed", resulting—in theory—in a more uniform and stable copper plating.

Even though the seed layer approach eliminates some of the copper/dielectric interface problems, other complications arise from contamination of the seed layer. In many conventional fabrication processes, seed layer deposition and the final copper ECD are performed in different apparatus. The handling, transfer, and queuing of a substrate that has just completed seed layer deposition provides a number of potential contamination sources—airborne gases or molecular particles, for example—that can cause pits and other anomalies in the seed layer surface. Typically, seed layers have a very high affinity for even minute amounts of contaminants. Even if only exposed for a minimal time, the relative concentration of such contaminants on the seed layer surface can increase dramatically—causing any number of structural anomalies. These anomalies in the seed layer surface can disrupt or inhibit the copper ECD process. For example, certain anomalies can render the seed layer surface hydrophobic, causing voids and other unstable or incomplete copper device structures to form during a plating process. Increased yield losses, device failures, and reliability problems result.

Certain difficulties of conventional processes are illustrated now in reference to prior art FIG. 1, which depicts a conventional fabrication process 100 involving seed layer handling. A substrate 102 is removed, directly or indirectly, by an operator 104 from a first processing apparatus 106 (e.g., a sputtering system), in which a seed layer is applied to substrate 102. Operator 104 then queues substrate 102 for processing by a second processing apparatus 108 (e.g., an ECD system). During its transition from apparatus 102 to apparatus 108, substrate 102 may be exposed to a number of contaminants 110 (e.g., airborne gases or particles).

The length of time that substrate 102 is exposed to contaminants 110 can vary widely, depending upon, for example, the amount of handling involved, the queue times at each apparatus, and the physical proximity of the apparatus. At worst, substrate 102 may be exposed to contaminants 110 for extended periods of time after extensive handling. Even in a best-case scenario—where apparatus 102 and 108 are proximal to one another, and handling by operator 104 and queue times are minimized—substrate 102 is still exposed to contaminants 110 long enough to incur some anomalies.

Some attempts have been made to address the problems arising from seed layer contamination. One such attempt involves storing substrates, after seed layer deposition and prior to ECD, in an inert environment (e.g., storage in nitrogen gas). Other attempts involve cleaning or repair of the seed layer prior in a separate apparatus prior to loading the substrate into ECD apparatus. Isolation methods are effective for the period of time that a substrate is stored in isolation, but fail to address exposure and handling involved in transferring substrates into and out of storage. Often, certain cleaning approaches are ineffective for particular contaminant chemistries. Cleaning approaches can also further damage, or even remove, significant portions of the seed layer—rendering the seed layer unusable. Seed repair methods often involve some measure of re-deposition of the seed layer—adding potentially numerous and costly extra processing steps. Importantly, most all such approaches fail to eliminate the exposure of the seed layer surface to some contamination during transfer between the distinct processing apparatus involved.

As a result, there is a need for a seed layer remediation system that effectively neutralizes seed layer contamination, providing non-destructive seed layer remediation in an easy, efficient and cost-effective manner.

SUMMARY OF THE INVENTION

The present invention provides a versatile system that neutralizes the effects of seed layer contamination and provides non-destructive seed layer remediation in an easy, efficient and cost-effective manner. The system of the present invention may be collocated, and even integrated, with other processing equipment (e.g., provided in situ within an ECD apparatus).

Specifically, the present invention provides a system that remediates contaminants, and contaminant-based anomalies, from a seed layer surface in a non-destructive manner. The present invention provides a remediation module. Handling systems or apparatus transfer a substrate, upon which a seed layer is already formed, into the remediation module. Once inside the remediation module, the substrate is subjected to one or more atmospheric treatments. Such treatments comprise exposure to ultraviolet (UV) light and exposure to oxygen, exposure to ozone, exposure to ambient atmospheric gases, or combinations thereof. Utilizing these treatments, contaminants are desorbed from the seed layer—to be shed in gaseous form or formed into oxides.

A controlled growth of oxidation may thereby be formed on the uppermost portion of the seed layer. This oxidation may serve as a barrier between the seed layer and any airborne environmental contaminants. The oxidation layer is dissolved upon introduction to an ECD plating bath, leaving a clean, contaminant and anomaly-free seed layer surface for plating.

The present invention thus renders more hydrophilic seed layers—increasing effectiveness of the ECD plating process and resulting in higher yields and fewer reliability problems when compared to existing methods and systems.

More specifically, one embodiment of the present invention provides a semiconductor processing module, comprising a housing adapted to enclose a semiconductor wafer. An ultraviolet radiation source is disposed within the housing, as is a treatment medium.

Another embodiment of the present invention provides a method of removing contaminants from a semiconductor substrate. The method includes providing a housing adapted to enclose a semiconductor substrate. An ultraviolet radiation source is disposed within the housing, as is a treatment medium. A semiconductor substrate is enclosed within the housing, and exposed to the treatment medium. The ultraviolet radiation source exposes the semiconductor substrate to ultraviolet radiation.

The present invention further provides a system for remediating organic contaminants from a copper seed layer deposited on an upper surface of a semiconductor wafer. Within this system, a housing is adapted to receive and enclose the semiconductor wafer. An ultraviolet radiation source is disposed within the housing, and adapted to expose the semiconductor wafer to ultraviolet radiation. An ozone generator is adapted to supply ozone into the housing, as a treatment medium for the semiconductor wafer. A conditioning system is also disposed within the housing, adapted to filter contaminants from the ozone.

Other features and advantages of the present invention will be apparent to those of skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which:

FIG. 1 is an illustration of a PRIOR ART seed layer handling system; and

FIG. 2 is an illustration of one embodiment of a seed layer remediation system according to the present invention.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The invention will now be described in conjunction with remediation of copper seed layers. The specific embodiments discussed herein are merely illustrative of specific ways to make and use the invention and do not limit the scope of the invention.

The present invention provides a system that remediates contaminants, and contaminant-based anomalies, from a seed layer surface in a non-destructive manner. The system of the present invention may be collocated, and even integrated, with other processing equipment (e.g., provided in situ within an ECD apparatus).

The present invention provides a remediation module. Handling systems or apparatus transfer a substrate, upon which a seed layer is already formed, into the remediation module. Once inside the remediation module, the substrate is subjected to one or more atmospheric treatments. Such treatments comprise exposure to UV-light and exposure to oxygen, exposure to ozone, exposure to ambient atmospheric gases, exposure to vacuums, or combinations thereof.

Utilizing these treatments, contaminants are desorbed from the seed layer—to be shed in gaseous form or formed into oxides. A controlled nominal growth of oxidation may thereby be provided on the uppermost portion of the seed layer. This nominal oxidation provides an effective barrier between the fragile and thin seed layer and any airborne environmental contaminants. The oxidation layer, and any contaminant contained therein, is dissolved upon introduction to an ECD plating bath—leaving a clean, contaminant and anomaly-free seed layer surface for plating. The present invention thus provides more hydrophilic seed layers—increasing effectiveness of the ECD plating process.

The present invention recognizes that many, if not most, seed layer contamination problems stem from even the briefest exposure of the seed layer surface to ambient environment prior to treatment in an ECD apparatus. The present invention further recognizes that existing processes are designed such that some significant level of seed layer exposure or handling is inherent.

The present invention provides a system that remediates contaminants, and contaminant-based anomalies, from a seed layer surface in a non-destructive manner. The present invention recognizes that the non-conformal nature of ECD plating can render major problems from even minor anomalies. Relatively minor pits and protuberances caused by contamination can make significant areas on the seed layer hydrophobic (i.e., resistant to thorough and consistent wetting), resulting in defects in the copper plating (e.g., voids).

The present invention recognizes that it is desirable to minimize or eliminate this phenomenon and, where possible, to improve the wetting characteristic of the seed layer surface (i.e., make it more hydrophilic). The present invention recognizes that this is especially critical where ECD processes rely on capillary filling phenomenon.

The present invention further recognizes that even when such anomalies can be removed by, for example, etching or some other stripping of the seed layer surface, such methods result in an undesirable thinning or removal of the already fragile and narrow seed layer. It is therefore desirable to provide a remediation system that removes contamination while, to the greatest extent possible, preserving the seed layer or, ideally, enhancing the seed layer.

The present invention provides a remediation module utilizing one or more atmospheric agents. The present invention may be utilized to produce a nominal oxidation layer on the uppermost portion of a seed layer. This nominal oxidation layer serves a number of purposes. Contaminants present upon the seed layer are subjected to the atmospheric agents, desorbing the contaminants from the seed layer. Those contaminants migrate or effuse out from the seed layer, and are either shed as gaseous compounds, or are formed into surface oxides.

The oxidation process traps the contaminants on the outer surface of the seed layer, allowing them to be dissolved upon introduction into an ECD plating bath. Prior to introduction to the plating bath, however, the oxidation layer serves as a protective barrier that inhibits ingress of other contaminants. After remediation with the present invention, semiconductor wafers may undergo some degree of pre-ECD handling and processing without concern for additional contamination. Optimally, however, remediation with the present invention is provided just prior to ECD and oxidation is minimized to the greatest extent possible.

The present invention recognizes that during the oxidation process, some portion of the seed layer itself will also be oxidized. This is, of course, a concern due to the relatively thin and fragile nature of most seed layers. The present invention further recognizes, however, that sacrificing a reasonably small outer portion of the seed layer in order to provide a smooth, contaminant free surface for plating is, in most cases, a reasonable exchange. The system of the present invention controls the length of the oxidation process, the accompanying environmental conditions, to minimize that amount of seed layer sacrificed.

Referring now to FIG. 2, one embodiment of a remediation system 200, according to the present invention, is illustrated. System 200 comprises a remediation module 202. Module 202 may be a stand-alone processing device or, alternatively, may be a component associated or integrated with some other processing device. Module 202 comprises a housing 204. Housing 204 defines a chamber within which a semiconductor wafer is enclosed, and treatment according to the present invention is performed. Depending upon the embodiment, housing 204 may be sealed or otherwise suitably augmented to perform in accordance with the present invention. A transfer system (not shown) moves an untreated semiconductor wafer 206 into housing 204. The transfer system may comprise a robotic handling system, or any other suitable automated assembly or manual process that performs in accordance with the present invention. Wafer 206 comprises a semiconductor substrate upon which a seed layer has been deposited, but upon which ECD or other plating processes have not yet been performed.

Within housing 204, substrate 206 is exposed to a treatment medium 208. Depending upon the embodiment, module 202 may comprise a UV light source 210 disposed upon or within housing 204 to expose wafer 206 or medium 208 to ultraviolet radiation (i.e. UV light). Any suitable source of ultraviolet radiation (e.g., a UV lamp) may be utilized.

In some embodiments, module 202 may also comprise a medium supply system 212 disposed on or within housing 204. Depending upon the embodiment and the particular medium 208 used, supply system 212 may comprise, for example, a forced gas inlet or an ozone generator. Module 202 may further comprise a medium conditioning system 214, also disposed on or within housing 204. System 214 may be utilized to effect desirable pressure changes upon medium 208, or may be used cyclically filter or refresh medium 208. For example, in certain embodiments, system 214 may comprise a vacuum pump, or other some other similar system, suitable for inducing a partial or complete vacuum within housing 204. In some alternative embodiments, for example, system 214 may comprise a ventilation system configured to draw medium 208 out to some filtration system, and return the same from filtration. Depending upon the particular embodiment, supply system 212 may reside within or be an integral part of conditioning system 214.

In one embodiment of system 200, module 202 comprises a UV light source 210. Module 202 further comprises conditioning system 214, configured to induce a partial vacuum (i.e., reduce atmospheric pressure) within housing 204. Medium 208 comprises ambient air that may or may not undergo some filtration before introduction into module 202.

Operationally, light organic contaminants present along the upper surface of wafer 206 (i.e., along the upper surface of the seed layer) are exposed to UV radiation from source 210. The UV radiation breaks chemical bonds formed by the contaminants. Depending upon the composition of medium 208, the UV radiation may also begin to form ozone from the environment within housing 204.

As this process proceeds, contaminants begin desorption toward the upper surface of the seed layer. Depending upon their specific physical properties, the contaminants are either completely desorbed into gaseous form 216, or begin to form oxides. The rate and extent of oxidation and ozonation depends upon the amount of oxygen present in medium 208. In addition to oxidizing certain contaminants, a small portion of the seed layer—nearest the surface—may also begin to oxidize. System 200 is configured to control the extent of copper oxidation from the seed layer. Oxidation, and ozonation, may be controlled by increasing or decreasing the amount of UV radiation emitted from source 210. Oxidation and ozonation may also be controlled by increasing or decreasing the partial vacuum, using conditioning system 214 and, optionally, by the introduction of oxygen via an oxygen supply system 212. As contaminants are desorbed into gaseous form, the composition of medium 208 is altered. Utilizing conditioning system 214 and, optionally, supply system 212, medium 208 may be periodically or continuously cycled to and from housing 204 for filtration of replacement.

In one alternative embodiment, system 214 is utilized to introduce or maintain a full vacuum within housing 204. No treatment medium 208 is introduced and ozonation is not promoted. Wafer 206 is exposed only to UV radiation. The UV radiation still effects a reaction from contaminants present in the seed layer. To the extent that such contaminants are desorbed into gaseous form, conditioning system 214 removes them from housing 204 as it maintains the vacuum. Contaminants left at the surface may be treated in another stage of remediation, in accordance with the present invention as described hereafter, or may be removed by some alternate means (e.g., etch or polish).

In another alternative embodiment, medium 208 comprises an oxygen-rich gas (i.e., pure or mostly pure oxygen). Again, supply 212 may be used to introduce pure oxygen into housing 204. Conditioning system 214 is utilized to maintain a desired composition and condition of medium 208. For example, system 214 may comprise some evaluation system to measure the level of oxygen present in medium 208. Responsive to this measurement processing, system 214 may dynamically adjust the rate at which medium 208 is cycled into or out of housing 204. The rates of desorption of contaminants, ozonation and oxidation may again be controlled increasing and decreasing the concentrations of UV radiation and oxygen present within housing 204. In alternative embodiments, further environmental stressors (e.g., a heat source) may be disposed upon or within housing 204 to accelerate the rates of desorption, oxidation and ozonation.

In another alternative embodiment, supply 212 may comprise an ozone generator or an inlet from an ozone generator, such that ozonation of medium 208 does not rely, primarily, on reactions initiated by UV source 210. Ozone is directly supplied, via supply 212, into housing 204 for medium 208. Again, the exact composition of medium 208 may be monitored and dynamically adjusted, through combined operation of conditioning system 214 and supply 212, as described above.

According to the present invention, each of these embodiments may be utilized singly or in combination with one another. System 200 may be designed to perform differing processes, according to different embodiments, for different lots of material. System 200 may comprise a single housing, adapted to perform all desired embodiments, or several different housings, each performing a single embodiments. Depending upon desired and actual processing characteristics, various embodiments may be performed in different orders or progressions. All such combinations and variations are comprehended by the present invention.

After treatment within housing 204 is complete, the transfer system moves the now-treated wafer 206 out of housing 204. In most cases, wafer 206 now comprises a thin layer of oxidation on the outermost portion of the seed layer. Wafer 206 may now be transferred or handled for further processing. In instances where contaminants are remediated without forming an oxide layer, wafer 206 is transferred directly into an ECD plating bath, or some other suitable plating mechanism.

Thus, with the present invention, a substrate is exposed to a UV-light atmospheric treatment system. The UV light treatment breaks down impurities and contaminants, optimally forming oxides that are easily burned off without extensive oxidation. Contaminant-based anomalies, and the yield loss and reliability problems that result therefrom, are virtually eliminated. The present invention optimizes the cleanliness and surface integrity of the seed layer, and thus renders more hydrophilic seed layers—optimizing the interface between seed layer and ECD films. The result is increased effectiveness of the ECD plating process and higher yields when compared to existing methods and systems.

The embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A semiconductor processing module comprising:
   a housing adapted to enclose a semiconductor wafer;
   an ultraviolet radiation source disposed within the housing; and
   a treatment medium disposed within the housing, wherein the treatment medium comprises ambient air.

2. The module of claim 1, wherein the ultraviolet radiation source comprises an ultraviolet lamp.

3. The module of claim 1, further comprising a medium supply system disposed within the housing.

4. The module of claim 3, wherein the medium supply system comprises a gas inlet.

5. The module of claim 3, wherein the medium supply system comprises an ozone generator.

6. A semiconductor processing module comprising:
   a housing adapted to enclose a semiconductor wafer;
   an ultraviolet radiation source disposed within the housing;
   a treatment medium disposed within the housing; and
   a medium conditioning system disposed within the housing, wherein the medium conditioning system is adapted to induce a partial vacuum within the housing.

7. The module of claim 6, further comprising a medium supply system disposed within the medium conditioning system.

8. The module of claim 6, wherein the treatment medium is a vacuum induced by the medium conditioning system.

9. The module of claim 6, wherein the medium conditioning system comprises a filtration system.

10. A system for remediating organic contaminants from a copper seed layer deposited on an upper surface of a semiconductor wafer, the system comprising:
    a housing adapted to receive and enclose the semiconductor wafer;
    an ultraviolet radiation source disposed within the housing and adapted to expose the semiconductor wafer to ultraviolet radiation;
    an ozone generator adapted to supply ozone into the housing as a treatment medium for the semiconductor wafer; and
    a conditioning system disposed within the housing and adapted to filter contaminants from the ozone, wherein said conditioning system is further adapted to induce a partial vacuum within said housing.

* * * * *